United States Patent [19]
Hanson

[11] 3,876,954
[45] Apr. 8, 1975

[54] MICROWAVE CIRCUIT HAVING LOCK DETECTION APPARATUS

[75] Inventor: Delon C. Hanson, Los Altos, Calif.

[73] Assignee: Hewlett-Packard Company, Palo Alto, Calif.

[22] Filed: Dec. 26, 1973

[21] Appl. No.: 427,618

Related U.S. Application Data

[62] Division of Ser. No. 173,766, Aug. 23, 1971, Pat. No. 3,818,365

[52] U.S. Cl. ................ 329/116; 325/445; 329/122; 333/1.1

[51] Int. Cl. ......................... H03k 3/335; H01p 1/32

[58] Field of Search .................... 329/116, 119, 122; 330/4.8, 53, 63, 34; 333/1.1; 325/445-446, 448

[56] References Cited

UNITED STATES PATENTS 3,195,051 7/1975 Chang ............................ 325/445 X 3,477,028 11/1969 Aslaken ............................ 325/446

OTHER PUBLICATIONS

Watanabe et al. "Extended-Range Phase-Locked Demodulator..." Electronics & Communications in Japan Vol. 52B, No. 11-1969 329-119.

*Primary Examiner*—Alfred L. Brody
*Attorney, Agent, or Firm*—A. C. Smith

[57] ABSTRACT

In a solid state microwave amplifier circuit, a plurality of amplifier stages are coupled together to form a power combiner. A loading circuit between the power combiner stages prevents power cancellation, and operation as locked oscillators is detected by a lock-sensing circuit.

4 Claims, 2 Drawing Figures

MICROWAVE CIRCUIT HAVING LOCK DETECTION APPARATUS

CROSS-REFERENCE TO RELATED APPLICATION

This is a divisional application to U.S. application Ser. No. 173,766 filed on Aug. 23, 1971, now U.S. Pat. No. 3,818,365, by Delon C. Hanson.

BACKGROUND OF THE INVENTION

One known approach to the high-power, solid state amplifiers for microwave communication systems and the like uses avalanche diodes in an injection-locked oscillator scheme wherein an avalanche diode oscillator circuit operates in saturation to produce peak power output at all times and the oscillator frequency tracks the frequency of the incoming microwave signal to produce peak power out at the input signal frequency.

To meet broadcast regulations, it is necessary to monitor the locked-oscillator operation to sense when the system goes out-of-lock so that a suitable alarm may be generated.

SUMMARY OF THE PRESENT INVENTION

The present invention provides a novel form of solid state microwave amplifier utilizing a series-connected negative resistance diode and an inductor, both connected in a series circuit with an input transmission line for transforming the incoming impedance to a low level. By selection of the value of the transformed impedance, the circuit will operate as a negative resistance amplifier or an oscillator. A high impedance transmission line coupled between the input transmission line and the inductor provides DC biasing to the diode.

By including a varactor diode in the series circuit between the inductor and the input transmission line, and by supplying the varactor with means for controlling the voltage across its terminals, the oscillator is made electrically tunable.

An "out-of-lock" monitoring circuit is employed to sense the frequency of operation of the system. A coupling element is provided in a microwave circulator located between the input and output ports thereof to obtain a sampling of the frequency of the input and output frequencies of the amplifier stage connected to the circulator. A mixer stage produces a DC output when the two frequencies are the same or in-lock which an AC signal is produced as a result of dissimilar frequencies present when the circuit is out-of-lock.

Thin film techniques are employed to produce the circuit elements, and these circuits are integrated in a package with the avalanche diodes, varactor diode, and circulators on a compact heat sink structure, the complete package providing optimum electrical interfacing between the various circuits as well as excellent heat transfer characteristics.

DESCRIPTION OF THE PREFERRED EMBODIMENTS

Figure 1:
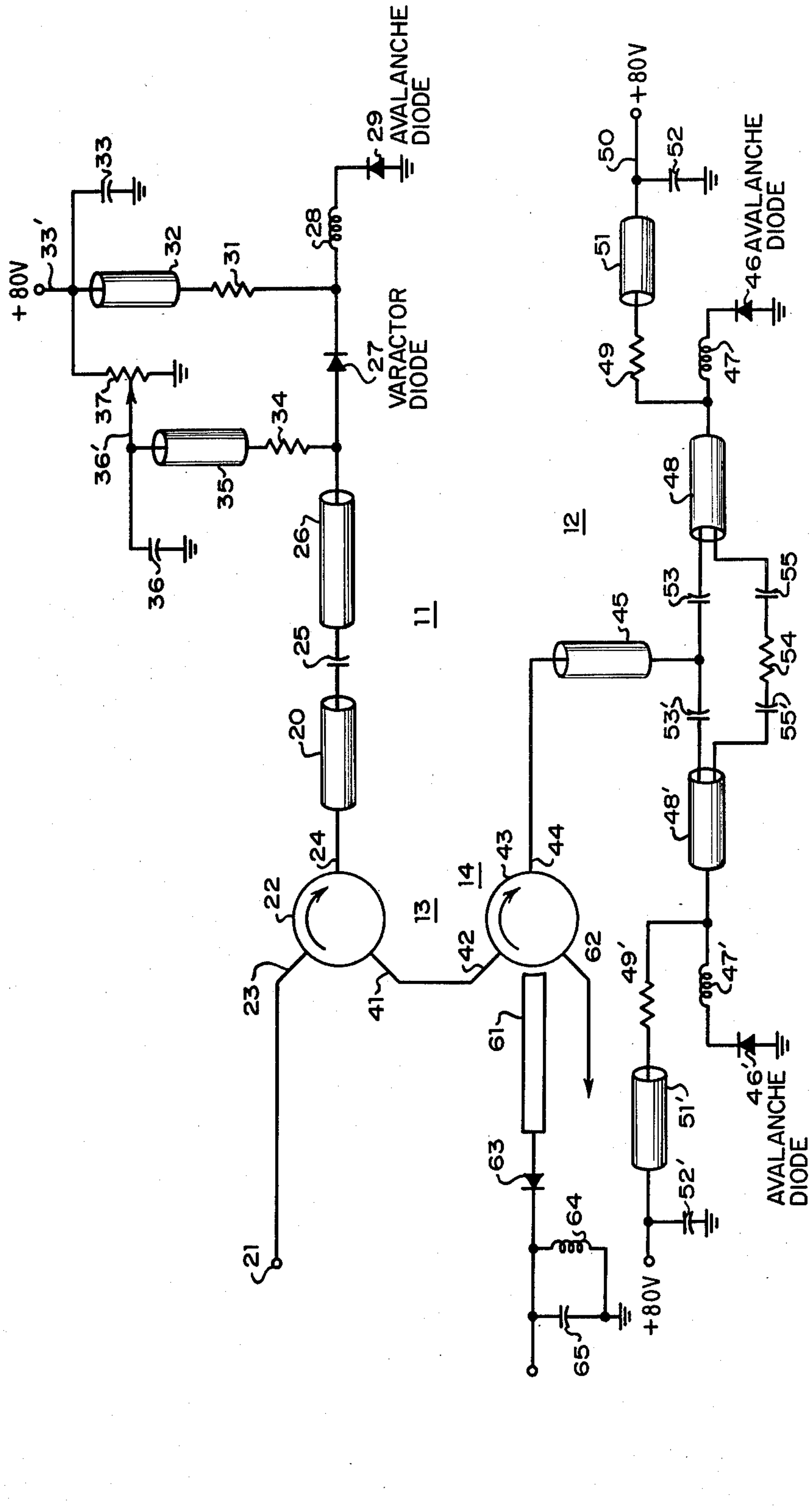
FIG. 1 is a schematic diagram of the two stage amplifier system of the present invention.
Figure 2:
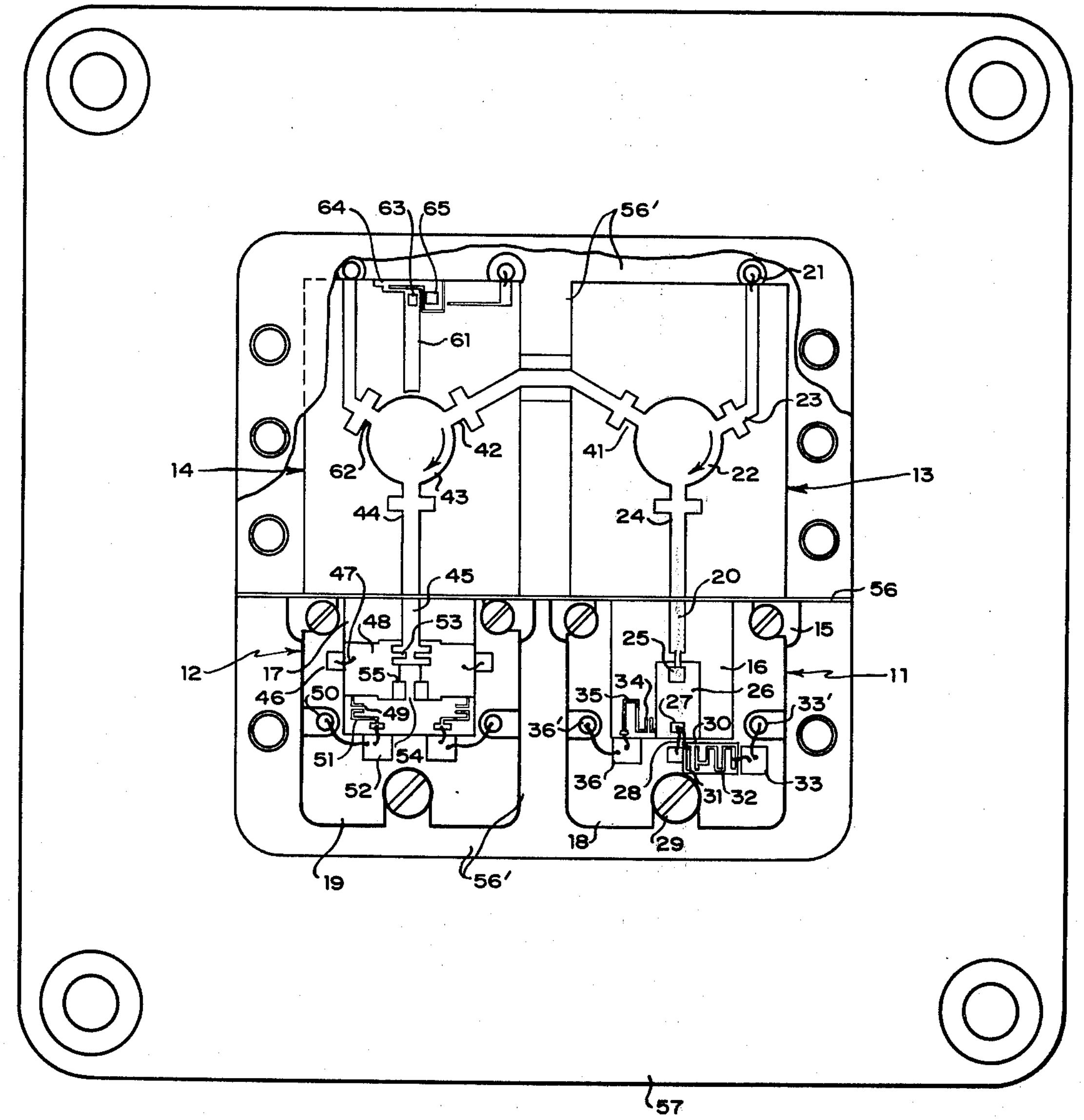
FIG. 2 is a plan view of the structure of the amplifier system of FIG. 1.

Referring to FIGS. 1 and 2 the microwave amplifier package comprises first and second amplifier stages 11 and 12 and two microwave ferrite circulator circuits 13 and 14 mounted on a conducting metallic base 15. The circuits for the first and second stage are formed by thin film techniques on 10 mil thick sapphire substrates 16 and 17, these substrates being bonded on 30 mil thick copper carriers 18 and 19, respectively.

The input to the first stage enters the package via input feedthrough 21, passes into the first circulator 22 via input port 23 and passes out to the first amplifier stage via second port 24. The first amplifier stage comprises a 50 ohm transmission line 20 connected by a mesh bond to a capacitor 25 of about 18.6 pF located at the input end of another transmission line 26 with a characteristic impedance of about 10.9 ohms and one quarter wave-length long at about 11 GHz. The transmission line 26 serves to transform the 50 ohm input down to a low impedance of about 2 ohms. A varactor diode 27, inductance line 28 of about 0.6 h, and avalanche diode 29 are connected in series with the inner end of the transmission line 26.

The avalanche diode 29 is mounted as an integrated part of the interchangeable carrier heat sink 18 which serves as electrical ground and also as the thermal heat sink for the diode. This provides a significant advantage in combined thermal and electrical performance over standard approaches where the avalanche diodes are separately packaged or mounted on independent heat sinks and require electrical interfacing circuitry with the system. It is noted that the avalanche diode is mounted on the carrier 18 adjacent the edge of the circuit substrate 16 where only a short inductance line 28 is needed for interconnection of the two diodes.

The circuit for providing DC biasing potential for the diodes comprises a quartz substrate 30 on which is formed a high impedance line including a 10 ohm resistor 31 and a transmission line 32 which is one quarter wavelength long at the center frequency, and the 18 pF capacitor 33 mounted on the carrier 18. This high impedance line is at one end coupled to the juncture of the varactor diode 27 and the inductor 28 and coupled at the other end to +80 volts via feedthrough 33'. A similar high impedance transmission line comprising 10 ohm resistor 34, quarter wave transmission line 35 and 18 pF capacitor 36 is coupled to the varactor diode 27 at its junction with transmission line 25, this high impedance line being DC returned via feedthrough 36' and the external potentiometer 37 of about 25 kilohms to the DC potential source. By adjusting the tap on the potentiometer 37, the voltage across the varactor diode 27 may be varied over a range from 0 to 60 volts and the avalanche diode oscillator circuit tuned over the operating band of the system.

In order to optimize the performance of the avalanche diode oscillator circuit it is necessary to control the effect of parasitics. In this circuit, the transmission line 26 transforms the real part of the input impedance from 50 ohms down to approximately 2 ohms. The series resistance of varactor diode 27 is about 1.9 ohms at 0 bias and reduces to about 0.9 ohms at breakdown. This series resistance is added directly to the real part of the 2 ohms transformed line impedance. Since the negative resistance of the avalanche diode decreases with increasing frequency, which corresponds to increasing varactor bias voltage, and hence decreasing series resistance of the varactor, direct real part matching is achieved over the frequency range, thus yielding uniform output power. The inductance 28 bonded to the avalanche diode 29 which primarily determines the frequency of oscillator is varied directly by the bias voltage on the varactor diode 27, representing a series tuning of the avalanche diode. Placing the varactor diode other than in series at the end of the input line 26 would produce a transform of the impedance and would result in an undesirable changing of the real impedance across the tuning range.

To avoid the introduction of parasitics to the low impedance varactor tuned oscillator, the high impedance biasing line makes contact with the oscillator circuit at only one point, i.e., to the series tuning inductance 28 interconnecting the varactor and avalanche diodes. The quarter wavelength line 32 presents a very high impedance at the center frequency of operation; even at the second harmonic frequency where the impedance of line 32 is low, the 10 ohm resistor 31 maintains the line impedance high relative to the device negative resistance to suppress second harmonic oscillation. A similar high impedance line supplies the variable DC return voltage to the varactor circuit via the external potentiometer 37 without introducing parasitics. The operation is enhanced by the absence of any blocking capacitors in the bias line and DC return line.

This novel oscillator circuit will produce a power output of about 22 dB and a tuning range of about 2 GHz, although this complete amplifier system is designed to operate only over a bandwidth of about 500 MHz, e.g., 10.7 to 11.2 GHz.

By omitting the varactor 27 and the circuit comprising components 34, 35, 36 and 37 used to change the voltage across the varactor, and with the line 26 coupled directly to the inductor 38, a fixed-frequency oscillator circuit results with all the desired characteristics of the tunable version.

The output of the first stage passes into the microwave ferrite circulator 22 via the second port 24 and flows through the third port 41 to the first port 42 of the second ferrite circulator 43 and out of the second port 44 to the power combiner stage 12. The circuit comprises a transmission line 45 of about 35 ohms which acts to transform the 50 ohms incoming impedance down to about 25 ohms.

There are two similar avalanche diode oscillator circuits in this stage and one such oscillator will be described, the elements of the second oscillator bearing the same reference numbers primed as similar components in the first oscillator. An avalanche diode 46 and .6 h inductor 47 are connected in series with a 10.9 ohm transmission line 48, which is one quarter wavelength long at the center frequency, and capacitor 52 coupled to 80 volts via feedthrough 50. As with the first stage, the avalanche diodes are mounted directly on the heat sink carrier for enhanced electrical and thermal performance, and the diodes are positioned adjacent the sapphire circuit subcarrier for optimized electrical interconnecting.

The two oscillator circuits are arranged in alignment, both being orthogonal to the input-output transmission line 45 and being coupled thereto via capacitors 53, 53′ which DC isolate the circuits so that they may employ independent DC biasing.

A novel circuit comprising a loading resistor 54 and DC isolating capacitors 55, 55′ is employed at the end of the transmission lines 48, 48′ at a point symmetric with the input-output line 45 to prevent power coupling between the oscillators. With the oscillators operating in phase and with their power outputs combining in the transmission line 45, the loading resistor has no effect. Should the oscillators be out-of-phase, however, and one tend to feed power into the other to cancel the power of the other, the resistor 54, which is positioned half on each side of the line of symmetry between the oscillators and through the transmission line 45, appears as a 50 ohm termination to the associated oscillator and absorbs any power which would otherwise tend to flow into the other oscillator. The oscillators of the power combiner stage are fixed tuned to about the center frequency of the operating band, e.g., 10.7 to 11.2 GHz for the particular system shown, the actual frequency of operation being pulled to the frequency of the incoming signal from the first stage. The first stage delivers about a 22 dBm signal to the power combiner stage which boosts the output passed to the utilization circuit via the second circulator 43 to about 30 dBm. Thus, a substantial power amplification is achieved by this system utilizing essentially only three avalanche diodes, one varactor, and two circulators.

In accordance with the present invention, a coupling circuit is provided to sample and compare the output signal of the first stage 11 with that of the second stage 12 to determine if the system is operating in-lock or out-of-lock. A coupling element including a transmission line 61 with its coupling end spaced about 0.003 inch from the circulator 43 is coupled to the signal in the circulator from the first stage and also to the signal in the circulator from the power combiner stage. The coupler 61 is located equidistant between the input port 42 and the output port 62 of the circulator 43 so as to provide equal coupling to the two signals. This arrangement provides an approximate −20 dB coupling so that a +2 dBm signal is obtained from the input signal to the second stage amplifier and a +10 dBm signal is obtained from the second stage output signal. These signals are delivered by the line 61 to a mixer circuit comprising a diode 63 connected in series with a parallel connected inductor 64 and capacitor 65. When the two frequencies are the same, i.e., the system is in lock, the output of the mixer is DC. When the frequencies are different, as in the out-of-lock condition, the output of the mixer is an AC signal which provides a warning of the out-of-lock condition.

I claim:

1. A microwave amplifier comprising:

electromagnetic wave circulating means having at least three signal ports for coupling electromagnetic wave signal from one signal port to the adjacent signal port which is oriented in a selected direction relative to such one signal port;

means coupling a first one of the signal ports of said circulating means to receive input signal;

amplifier means having a common input and output signal port coupled to a second one of the signal ports of said circulating means;

means including a third one of the signal ports of said circulating means for providing an amplified output signal; and detector means coupled to respond to the electromagnetic wave signals present at the first and third signal ports for producing an indication of the phase relationship of signals present at said first and third signal ports.

2. A microwave amplifier as in claim 1 wherein said amplifier means includes a plurality of amplifier circuits, each having a negative resistance diode, and includes coupling means for coupling said amplifier circuits to said common signal port with D.C. isolation between amplifier circuits, and bias means is coupled to supply bias signals independently to the negative resistance diode in each amplifier circuit.

3. A microwave amplifier as in claim 2 wherein said coupling means includes a load differentially coupled between a pair of said amplifier circuits for loading said amplifier circuits only in response to signals therefrom which are not in phase.

4. A microwave amplifier as in claim 2 wherein said circulating means and said detector means are disposed on an insulating substrate mounted on a metal carrier;

said negative resistance diodes are mounted in thermal contact with the metal carrier; and said coupling means is disposed on said substrate and includes for each amplifier circuit an inductor interconnected in series circuit between said diode on said carrier and said common signal port on said substrate.

* * * * *

UNITED STATES PATENT OFFICE
CERTIFICATE OF CORRECTION

Patent No. 3,876,954 Dated April 8, 1975

Inventor(s) Delon C. Hanson

It is certified that error appears in the above-identified patent and that said Letters Patent are hereby corrected as shown below:

Column 1, line 5, "to" should read -- of --; line 48, "which" should read -- while --.

Signed and sealed this 17th day of June 1975.

(SEAL)
Attest:

RUTH C. MASON
Attesting Officer

C. MARSHALL DANN
Commissioner of Patents
and Trademarks